United States Patent [19]
Taylor et al.

[11] Patent Number: 5,102,694
[45] Date of Patent: Apr. 7, 1992

[54] PULSED CHEMICAL VAPOR DEPOSITION OF GRADIENT INDEX OPTICAL MATERIAL

[75] Inventors: Raymond L. Taylor, Saugus; Hemant D. Desai, Billerica, both of Mass.

[73] Assignee: CVD Incorporated, Woburn, Mass.

[21] Appl. No.: 588,788

[22] Filed: Sep. 27, 1990

[51] Int. Cl.$^5$ ............................................. B05D 5/06
[52] U.S. Cl. .................................. 427/162; 427/250; 427/255.2; 427/314
[58] Field of Search ..................... 427/162, 250, 255.2, 427/314

Primary Examiner—Bernard Pianalto
Attorney, Agent, or Firm—Gerald K. White

[57] ABSTRACT

Periodic pulsing of the gaseous reactant flows during chemical vapor deposition of gradient index optical material markedly improves the refractive index homogeneity of the deposit with the frequency of the pulsing being variable over a wide range but the number and size of the inhomogeneities, or nodules, being significantly reduced at higher pulsing frequencies.

32 Claims, 4 Drawing Sheets

OPTICAL MICROGRAPH OF A TYPICAL INHOMOGENEOUS REGION IN GRADIENT INDEX $ZnS_xSe_{1-x}$. (MAGNIFICATION 25X).

RUN 9091-07
25 X

RUN 9091-05
25 X

RUN 9091-06
25 X

OPTICAL MICROGRAPH OF A TYPICAL INHOMOGENEOUS REGION IN GRADIENT INDEX $ZnS_xSe_{1-x}$. (MAGNIFICATION 25X).

DRAMATIC REDUCTION OF THE INHOMOGENEOUS REGION IN GRADIENT INDEX $ZnS_xSe_{1-x}$ BY THE PULSED CVD TECHNIQUE. (MAGNIFICATION 200 X)

PULSED CHEMICAL VAPOR DEPOSITION OF GRADIENT INDEX OPTICAL MATERIAL

This invention was made with Government support under Contract No. DAAB07-87-C-F108 awarded by the U.S. Army CECOM. The Government has rights in this invention.

BACKGROUND OF THE INVENTION

1. Field of the Invention

This invention relates to a method of producing inhomogeneous index free gradient index optical materials, that is, gradient index optical materials that are free of index irregularities (inhomogeneities) and have a uniform refractive index at all points on a surface thereof. The invention involves the production of infrared transmitting material the index of refraction of which changes as a function of thickness of the material.

2. Description of the Prior Art

The production in the prior art of gradient index profile) by means of the chemical vapor deposition (CVD) reaction or process has been hampered by the presence of index irregularities (inhomogeneities), or nodules, in the deposited materials. The cause of these anomalies is not well understood. It is believed, however, that these anomalies are due to gas phase nucleation. In gas phase nucleation the reacting gases react above the substrate, forming molecules of the alloy being deposited, which molecules agglomerate and eventually fall onto the substrate. Gas phase nucleation thus results in the formation of inhomogeneities, or nodules, on the surface of the substrate.

Zinc sulfide and zinc selenide are produced in a CVD reaction by reacting vaporized zinc with hydrogen sulfide and hydrogen selenide, respectively, with argon, for example, being used as a carrier gas. These materials that are so produced exhibit different indices of refraction over the useful transmission range (0.5-12 $\mu$m) thereof. Furthermore, the alloy Zn $S_x$ $Se_{(1-x)}$ exists for $0 < x < 1$, that is, for values of x that lie between zero and one. This alloy has an index of refraction that is directly related to the composition of the alloy. Therefore, it is possible by proportioning the relative magnitudes of the flows of hydrogen sulfide and hydrogen selenide to produce a material with an arbitrary gradient index profile.

The gradient index ZnS-ZnSe materials produced by the CVD process in the prior art exhibit areas of index irregularities, as illustrated in FIG. 1 of the drawings. These index irregularities produce wavefront distortions in an optical system. The amount of the distortion is related to the magnitude of the index irregularity. Therefore, in the production of inhomogeneous index free gradient optical materials, it is essential to reduce or eliminate this abnormality.

SUMMARY OF THE INVENTION

An object of the invention is to provide a method for eliminating or at least minimizing index irregularities that are generated during the CVD growth of gradient index optical materials.

Another object of the invention is to provide a method for improving the refractive index homogeneity of chemical vapor deposited gradient index materials.

Still another object of the invention is to provide a method for producing inhomogeneous index free gradient index materials, said method comprising the following steps in the following order:

(a) positioning a substrate in a chamber;

(b) heating said chamber and allowing the average temperature of the substrate to reach a chosen deposition temperature which is at least as high as the temperature required for the deposition of the particular inhomogeneous index free gradient index material to be formed in a particular chemical vapor deposition reaction from a reaction of at least two vaporized elements generally designated F and G, one of which elements may be a metal;

(c) introducing flows of said at least two vaporized elements into said chamber, the relative magnitudes of the flows of said at least two vaporized elements being so proportioned that they react with each other to deposit gradient index optical material on the substrate, said gradient index optical material comprising an alloy the general formula of which includes the expression $F_x G_{(1-x)}$ wherein the value of x lies between zero and one and is controlled by the partial pressures of the vaporized elements, with the partial pressures of the vaporized elements being controlled by the magnitudes of the flows thereof; and (d) periodically reducing at least some of the flows of said vaporized elements into said chamber, whereby the deposit of the gradient index optical material on said substrate is caused to be inhomogeneous index free.

Another object of the invention is to provide such a method for producing inhomogeneous index free gradient index materials wherein, in step (b) the deposition of the particular inomogeneous index free gradient index material to be formed in a particular chemical vapor deposition is from a reaction of three vaporized elements generally designated E, F and G one or more of which may be a metal, and wherein in step (c) the magnitudes of the flows of the three vaporized elements introduced into the chamber are so proportioned that they react with each other to deposit gradient index material on the substrate, with the gradient index optical material comprising an alloy of the general formula $E F_x G_{(1-x)}$.

These and other objectives of the present invention are achieved in accordance with the invention by pulsing the vaporized or gaseous reactants (not necessarily all) into the CVD reactor. More specifically, the gaseous reactant flow rate is periodically reduced substantially to zero, for example, and then reset to a normal flow rate or condition. This cycling of the flow rate of the reactants is continued for the entire growth period of the CVD deposit.

The various features of novelty that characterize the invention are pointed out with particularity in the claims annexed to and forming a part of this specification. For a better understanding of the invention, its operating advantages and specific objects attained by its use, reference is made to the accompanying drawings and descriptive matter in which preferred embodiments of the invention are illustrated.

BRIEF DESCRIPTION OF THE DRAWINGS

With this summary of the invention, a detailed description follows with reference being made to the accompanying drawings which form part of the specification, of which.

DESCRIPTION OF THE PREFERRED EMBODIMENTS

As used herein:

"Gradient index optical material" describes electromagnetic wave transmitting material the index of refraction of which changes as a function of thickness of the material.

"Inhomogeneous index free gradient index optical material" refers to gradient index optical material the refractive index of which is constant, that is, substantially the same at all points on a surface thereof.

"Chemical vapor deposition reaction" describes a reaction which involves the transport of a vapor of a compound which generally, although not necessarily, contains a metal to a usually hot substrate, followed by a thermal or chemical reduction of an ion (usually a metal ion) in the vapor species at or near the substrate, followed by the nucleation and deposition of the reduced species onto the substrate.

"Periodic reduction to zero of some of the reactant flows" in the CVD reactor means the recurrence of such reductions after a definite interval as a phase in a cyclical system.

"Period" is the time that elapses between any two successive similar reductions to zero of the reactant flows as a regularly repeated event.

In accordance with the invention, a conventional chemical vapor deposition process may be employed to form the deposit of gradient material on a substrate surface. Such a process is disclosed in U.S. Pat. No. 4,265,982 granted on May 5, 1981 to William J. McCreary, et al., the disclosure of which is incorporated herein by reference. Another such process is disclosed in application for U.S. patent bearing Ser. No. 07/389,248, filed Aug. 3, 1989 by J. S. Goela, et al., assigned to the assignee of the present invention, and the disclosure of which is incorporated herein by reference.

The invention may be simply described as "pulsed CVD," where the gaseous reactants are pulsed. More particularly, the reactant flow rate is cyclically varied, being reduced for a period in each cycle, and then reset to a normal flow rate condition. This cycling is continued during the entire growth period.

Figure 1:
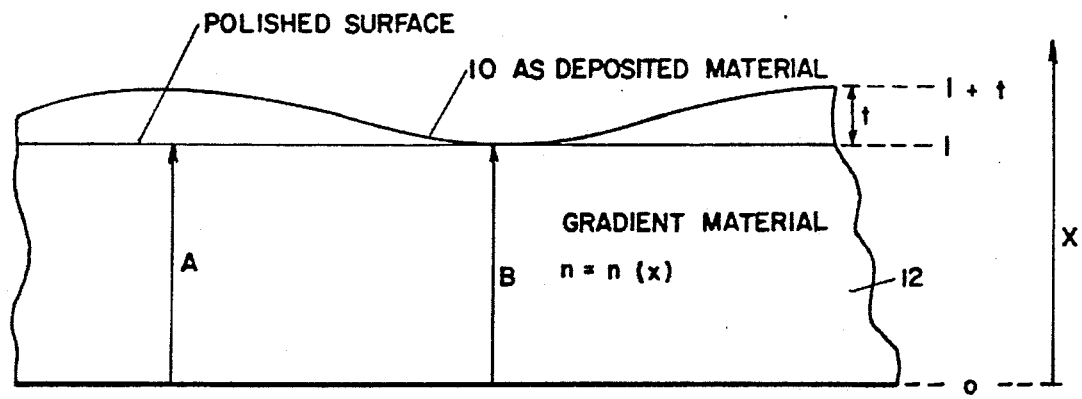
FIG. 1 schematically illustrates wave-front distortion in CVD grown gradient index material polished to a thickness (1) with the roughness of the as deposited surface being given by (t), the difference between the peaks and valleys on the surface.
Figure 2:
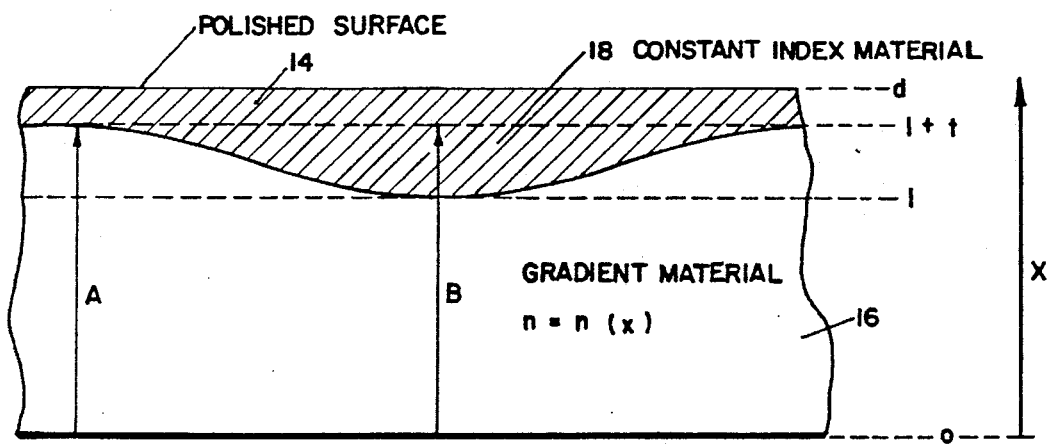
FIG. 2 schematically illustrates wave-front distortion in CVD grown gradient index material as in FIG. 1 but with a constant index layer thicker than the surface irregularity (t) and polished to a thickness (d)

With a pulsed CVD reactor used to produce gradient index $Zn\ S_x\ Se_{(1-x)}$, two different conditions are considered in FIGS. 1 and 2. In the case of FIG. 1, a gradient index material 10 having a refractive index n of nx is shown as having been grown on a substrate 12 and then polished to a thickness (1). The roughness of the as-deposited surface is indicated by (t), the difference in the peaks and valleys on the surface.

In the case of FIG. 2, a gradient index material 14, also having a refractive index n of nx, is grown on a substrate 16, as in FIG. 1, but then the index of the material being deposited is held constant and the growth is continued sufficiently long that the thickness of the constant index part, designated 18, is greater than the surface roughness (t).

The optical path difference (OPD) for rays following paths designated A and B for the two cases of FIGS. 1 and 2 can be calculated for a linearly varying index. The OPD must be less than λ/4 for the wavefront distortion to be less than λ/4, a value indicative of good optical material. In terms of (t), this requirement becomes:

$$\text{Case of FIG. 1, } (t) \leq \frac{\lambda/2}{(\Delta n + \lambda/2)}$$

$$\text{Case of FIG. 2, } (t) \leq \frac{\lambda}{2\Delta n}$$

where Δn represents the index change from the substrate to the as-deposited surface. For a ZnS-ZnSe axial gradient lens with a linear index profile, (t) becomes less than 0.316 mm and 0.344 mm for the cases of FIG. 1 and FIG. 2, respectively, in order to have less than λ/4 wavefront distortion at 10.6 μm. For convenience of illustration, these calculations are only approximations.

EXAMPLE I

Three depositions of axial gradient index $Zn\ S_x\ Se_{(1-x)}$ material (AGRIN) were run (runs 9091-05, 6 and 7). During run 9091-05, the duration of which was 90 hours, every thirty minutes the process gases $H_2S$ and $H_2Se$ were set to zero for approximately 10 seconds and then reset to their proper values, with the flow of vaporized zinc being held constant. In run 9091-06 the material was deposited using the same process conditions and duration as in run 9091-05, without the cycling of the gaseous reactant flows. In run 9091-07, again using the same process conditions and duration of growth, cycling of flows took place every fifteen minutes. TABLE I below lists the important process parameters used in these depositions.

TABLE I

| RUN NO. 9091 | 05 | 06 | 07 |
| --- | --- | --- | --- |
| TEMPERATURE (°C.) | 655–690 | 655–690 | 655–690 |
| PRESSURE (TORR) | 30 | 30 | 30 |
| FLOW CYCLING | 10 SEC/ 30 MIN | NONE | 10 SEC/ 15 MIN |

Figure 5:
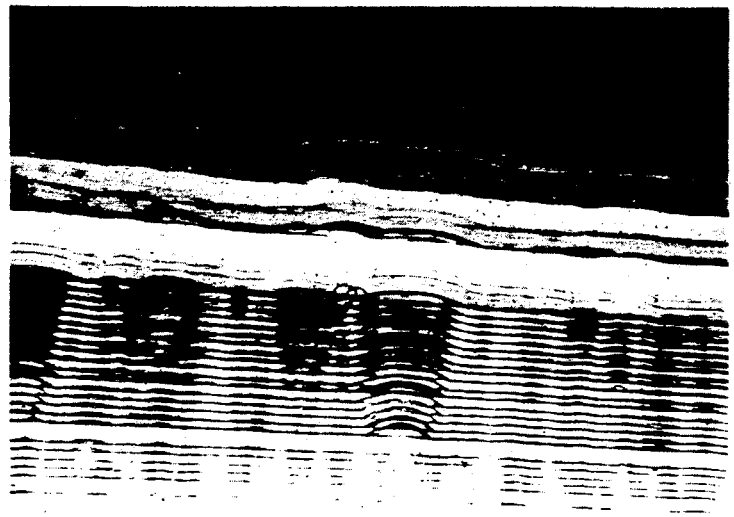
FIG. 5 is an optical micrograph illustrating nodules from a gradient index deposition in which the vaporized or gaseous reactant flows were reduced to zero for about ten (10) seconds every fifteen minutes during the entire period of the growth.
Figure 3:
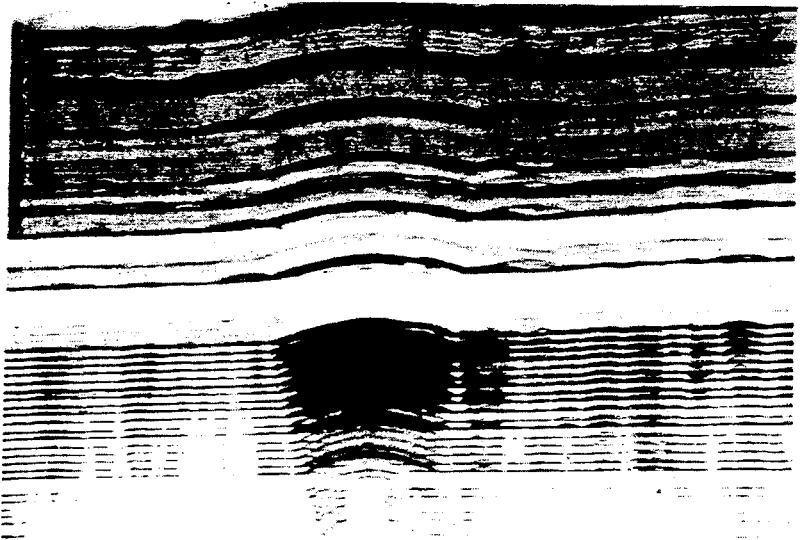
FIG. 3 is an optical micrograph illustrating nodules from a gradient index deposition in which the gaseous reactant flows were reduced to zero for about ten (10) seconds every thirty (30) minutes.
Figure 4:
FIG. 4 is an optical micrograph illustrating nodules from a gradient index deposition in which the gaseous reactant flows were maintained substantially constant during the entire period of growth.

Examination at the cross sections of the deposits of the AGRIN material produced during the three runs reveal a dramatic reduction of nodule size from run 9091-05 to 9091-6 to 9091-07, as illustrated in FIGS. 3, 4 and 5, respectively. All three of the micrographs of FIGS. 3, 4 and 5 were taken at the same magnification, specifically a magnification of 25×.

The control of the gradient index depositions of EXAMPLE I were handled manually. The control of the process parameters for the gradient index depositions may also be made automatic, however, specifically by a microprocessor in conjunction with analog hardware which may comprise a programmed HP 9000/300 computer along with a HP 3852 A data acquisition and control module. To produce AGRIN material, the process conditions were changed every 54 seconds, representing a change in flow of $1.5 \times 10^{-5}$ liters per minute. This small change is much less than the specified resolution of the mass flow controller (a maximum resolution of 0.0005 lpm). Furthermore, this flow change represents an index change of approximately 0.000022. Since the mass flow controller is an analog device, the term "maximum resolution" really means "maximum measurable resolution." Along with these changes, the flow rates were cycled every fifty-four (54) seconds. That is to say, every fifty-four (54) seconds the flow of the process gases, hydrogen sulfide and hydrogen selenide were reduced to zero for ten (10) seconds.

EXAMPLE II

Three depositions of AGRIN material were run (runs 9091-08, 09, 10). For these runs the deposition was controlled by a microprocessor, which held the flow of vaporized zinc constant and cycled the process gases hydrogen sulfide and hydrogen selenide every fifty-four (54) seconds, reducing the flow of the latter gases to zero for ten (10) seconds in each cycle. During these runs a modified deposition system was used. Specifically, the length of the deposition box was increased from twelve (12) to eighteen (18) inches and the injector diameter was made larger, from one-eighth ($\frac{1}{8}$) inch to one-quarter ($\frac{1}{4}$) inch. This geometry prevented the flow of vaporized zinc, hydrogen sulfide and hydrogen selenide from impinging directly on the reactor baffle plate and led to a laminar flow condition in the deposition, which, in turn, led to a more uniform thickness profile. With the reactor pressure maintained at 30 TORR, the important other deposition process parameters are listed below in TABLE II.

TABLE II

| RUN NO. 9091 | 08 | 09 | 10 |
|---|---|---|---|
| DEPOSITION TEMP (°C.) | 650–680 | 670–700 | 690–720 |
| INJECTOR SIZE (inches) | $\frac{1}{8}$ | $\frac{1}{4}$ | $\frac{1}{4}$ |
| BOX LENGTH (inches) | 12 | 18 | 18 |

It was found that the size and number of nodules were not impacted by the higher temperature depositions used during runs 9091-09 and 9091-10. The duration of the run in each case was 90 hours.

Figure 6:
FIG. 6 is an optical micrograph of a typical inhomogeneous index region in gradient index $Zn\ S_x\ Se_{(1-x)}$.
Figure 7:
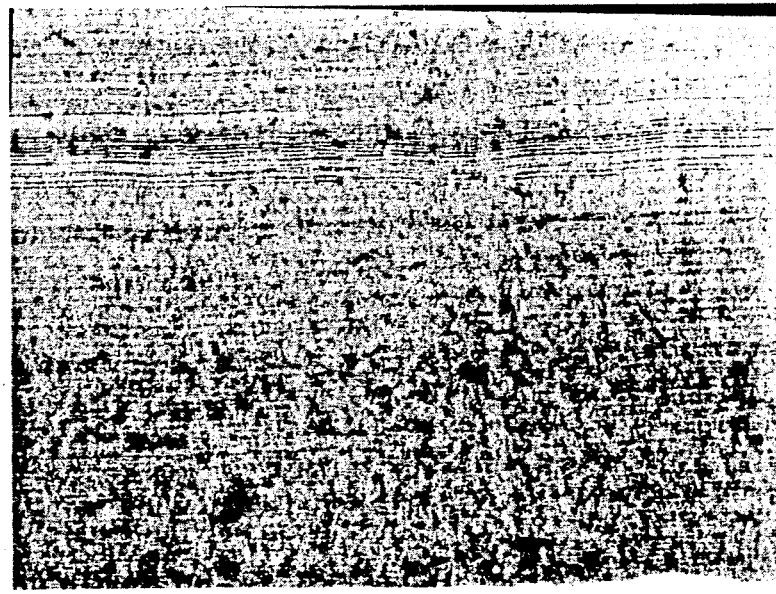
FIG. 7 is an optical micrograph illustrating nodules from a gradient index deposition in which the gaseous reactant flows were reduced to zero for about ten seconds every fifty-four seconds.

Examination at the cross sections of the AGRIN materials produced during three runs revealed a significant reduction in both the number and size of the nodules from run 9091-08 to 9091-10, as illustrated in FIGS. 6 and 7. The optical micrograph of the inhomogeneous index region in gradient index Zn $S_x$ $Se_{(1-x)}$ produced during run 9091-08 is shown in FIG. 6. The optical micrograph of FIG. 7 shows the dramatic reduction of the inhomogeneous index region in gradient index Zn $S_x$ $Se_{(1-x)}$ by the pulsed CVD technique employed during run 9091-10. The reduction of the inhomogeneous index region in FIG. 7 is even more dramatic when it is noted that the magnification of the optical micrograph there shown is 200.

EXAMPLE III

In Run No. 9091-16 Zn $S_x$ $Se_{(1-x)}$ material was produced under deposition conditions, as follows:
DEPOSITION TEMP (°C.)—650–720
INJECTOR SIZE (inches)—$\frac{1}{4}$
BOX LENGTH (inches)—18

Figure 8:
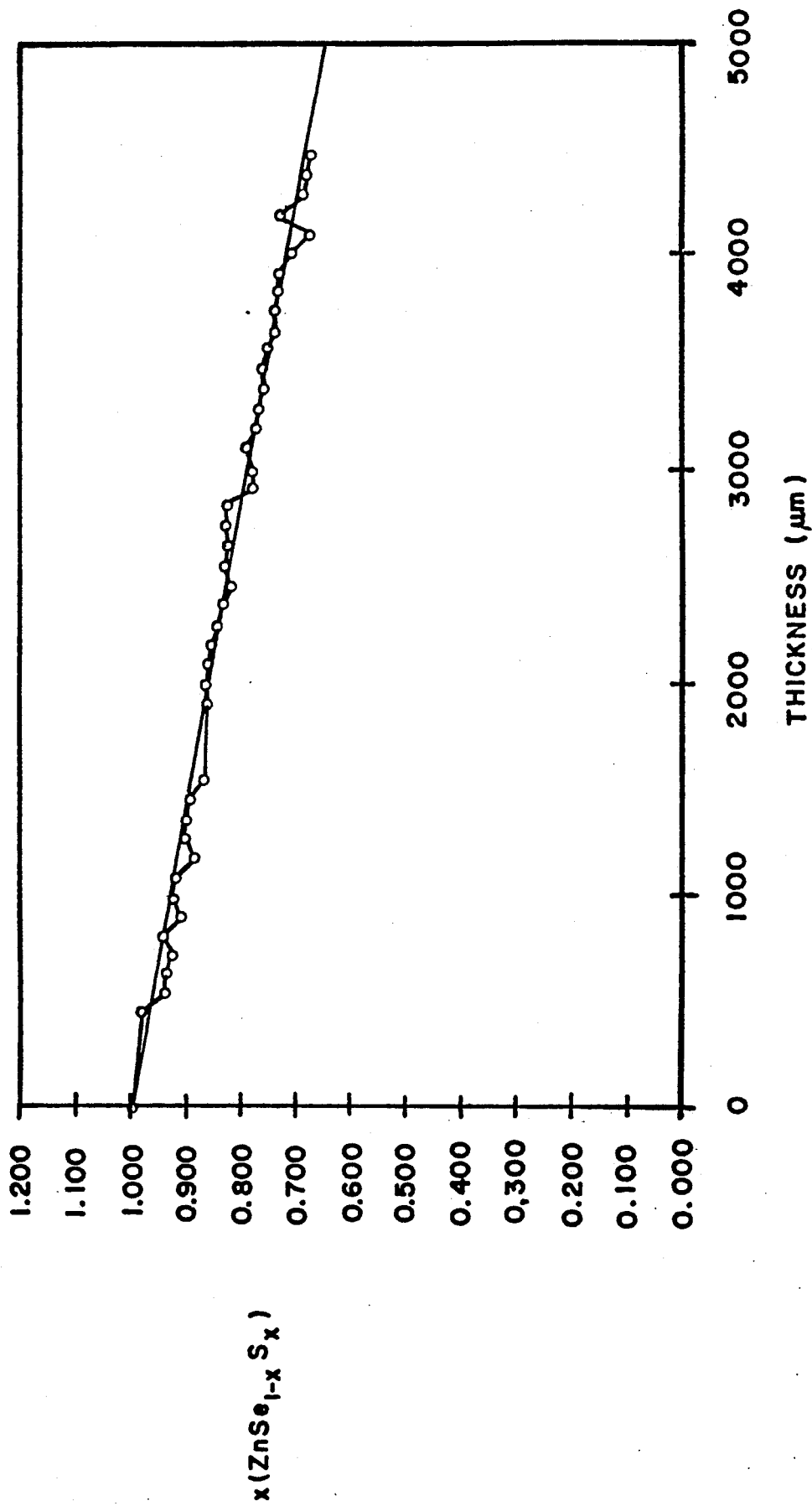
FIG. 8 is a graph illustrating the composition of $Zn\ S_x\ Se_{(1-x)}$ material as a function of the material thickness.

The material so produced was characterized by Scanning Electron Microscopy with an Energy Dispersive X-ray Spectroscopy attachment. This technique measures the composition of material in atomic percent as a function of sample thickness. The index of refraction in Zn $S_x$ $Se_{(1-x)}$ is proportional to the composition of the material. Hence, these results can be interpreted to determine the index of refraction gradient of the material. The Zn $S_x$ $Se_{(1-x)}$ material produced in Run No. 9091-16 was characterized by this technique. The results are shown in FIG. 8 of the drawings.

As those skilled in the art will understand, the invention can be used anywhere the composition of the material can be changed, and has particular utility in the production of other gradient index optical materials or alloys such as silicon/germanium ($Si_x$ $Ge_{(1-x)}$ for $0 < x < 1$) combining silicon sources such as silane, disilane and chlorinated silanes such as, though not limited to, tetrachlorosilane, with germanium sources such as germane, digermane and other germanium sources. Similarly, index gradients can be produced in gallium arsenide/aluminum arsenide ($Ge_x$ $Al_{(1-x)}$ As for $0 < x < 1$) where the flow of the gallium and the aluminum source is changed while maintaining the arsenic source flow in order to produce the desired index gradient. Numerous other optical material systems can be produced utilizing this invention including gallium indium phosphide ($Ga_x$ $In_{(1-x)}$ P for $0 < x < 1$) and aluminum gallium nitride ($Al_x$ $Ga_{(1-x)}$ N for $0 < x < 1$).

Thus, in accordance with the invention, there has been provided a method for eliminating or at least minimizing index discontinuities that tend to be generated during the CVD growth of gradient index optical materials. This result is achieved by pulsing the gaseous reactants into the CVD reactor. Dramatic results have been achieved while pulsing at low as well as higher frequencies, with one pulse every thirty minutes to one pulse every 54 seconds. The best results in respect of the reduction of the number and size of the nodules in the AGRIN material was achieved at the higher frequency. For best results, a laminar flow of the reactant gases in the reactor is preferred with the deposition temperature in a range of 655°–720° C., a temperature of about 700° C. being preferred.

With this description of the invention in detail, those skilled in the art will appreciate that modifications may be made to the invention without departing from its spirit. Therefore, it is not intended that the scope of the invention be limited to the specific embodiment illustrated and described. Rather, it is intended that the scope of the invention be determined by the appended claims and their equivalents.

What is claimed is:

1. A method for producing inhomogeneous index free gradient index materials, said method comprising the following steps in the following order:
   (a) positioning a substrate in a chamber;
   heating said chamber and allowing the average temperature of the substrate to reach a chosen deposition temperature which is at least as high as the temperature required for the deposition of the particular inhomogeneous index free gradient index material to be formed in a particular chemical vapor deposition reaction from a reaction of at least two vaporized elements generally designated F and G, one of which elements may be a metal;

(c) introducing flows of said at least two vaporized elements into said chamber, the relative magnitudes of the flows of said at least two vaporized elements being so proportioned that they react with each other to deposit gradient index optical material on said substrate, said gradient index optical material comprising an alloy the general formula of which includes the expression $F_x G_{(1-x)}$ wherein the value of x lies between zero and one and is controlled by the partial pressures of the vaporized elements, with the partial pressures of the vaporized elements being controlled by the magnitudes of the flows thereof; and (d) periodically reducing some at least of the flows of said vaporized elements into said chamber, whereby the deposit of gradient index optical material on said substrate is caused to be inhomogeneous index free.

2. A method as defined by claim 1 wherein in step (b) the deposition of the particular inhomogeneous index free gradient index material to be formed in a particular chemical vapor deposition is from a reaction of three vaporized elements generally designated E. F and G, and wherein, in step (c) the magnitudes of the flows of the vaporized elements introduced in the chamber are so proportioned that they react with each other to deposit gradient index material on the substrate, with the gradient index optical material comprising an alloy of the general formula $E F_x G_{(1-x)}$.

3. A method for producing inhomogeneous index free gradient index materials, said method comprising the following steps in the following order:
(a) positioning a substrate in a chamber;
(b) heating said chamber and allowing the average temperature of the substrate to reach a chosen deposition temperature which is at least as high as the temperature required for the deposition of the particular inhomogeneous index free gradient index material to be formed in a particular chemical vapor deposition reaction from a reaction of a vaporized element generally designated E with at least two gaseous reactants F and G, respectively, that react therewith;
(c) introducing flows of said vaporized element and of said at least two gaseous reactants into said chamber, the relative magnitudes of the flows of said at least two gaseous reactants being so proportioned that they react with said vaporized element to deposit gradient index optical material on said substrate, said gradient index optical material comprising an alloy having the general formula $E F_x G_{(1-x)}$ wherein the value of x lies between zero and one and is controlled by the partial pressures of the gaseous reactants, with the partial pressures of the gaseous reactants being controlled by the magnitudes of the flows thereof; and
(d) periodically reducing some at least of the flows of said vaporized element and of said at least two gaseous reactants into said chamber, whereby the deposit of gradient index optical material on said substrate is caused to be inhomogeneous index free.

4. A method as defined in claim 3 wherein said vaporized element is zinc and said at least two gaseous reactants are hydrogen sulfide and hydrogen selenide whereby the gradient index optical material produced in steps (c) and (d) is $Zn S_x Se_{(1-x)}$ for values of x between zero and one.

5. A method as defined in claim 4 wherein the temperature of the substrate as specified in step (b) is in the range 650° C. to 720° C.

6. A method as defined in claim 4 wherein the temperature of the substrate as specified in step (b) is about 700° C.

7. A method as defined in claim 3 wherein the flows of said vaporized element and of said at least two gaseous reactants are laminar.

8. A method as defined in claim 7 wherein said vaporized element is zinc and said at least two gaseous reactants are hydrogen sulfide and hydrogen selenide whereby the gradient index optical material produced in steps (c) and (d) is $Zn S_x Se_{(1-x)}$ for values of x between zero and one.

9. A method as defined in claim 8 wherein the temperature of the substrate as specified in step (b) is in the range 650° C. to 720° C.

10. A method as defined in claim 8 wherein the temperature of the substrate as specified in step (b) is about 700° C.

11. A method as defined by claim 3 wherein in step (d) the flow of said vaporized element is maintained constant and the periodic reductions of said some at least of said gaseous reactant flows is substantially to zero flow.

12. A method as defined by claim 11 wherein in step (d) the duration of such reductions in flow of said some at least of said gaseous reactant flows is approximately ten (10) seconds.

13. A method as defined by claim 12 wherein in step (d) the ratio of the period of such periodic reductions in the flow of said gaseous reactant flows to the duration of each of the successive reductions is in the range from about 5 to 1 to 180 to 1.

14. A method as defined by claim 12 wherein in step (d) the period of such periodic reductions in the flow of said gaseous reactant flows is about thirty (30) minutes.

15. A method as defined by claim 12 wherein in step (d) the period of such periodic reductions in the flow of such gaseous reactant flows is about fifteen (15) minutes.

16. A method as defined by claim 12 wherein in step (d) the period of such periodic reductions in the flow of such gaseous reactant flows is about fifty-four (54) seconds.

17. A method of producing inhomogeneous index free gradient index optical materials, said method comprising the following steps in the following order:
(a) positioning a substrate in a chamber;
(b) heating said chamber and allowing the average temperature of the substrate to reach a chosen deposition temperature which is at least as high as the temperature required for the deposition of the particular inhomogeneous index free gradient index material to be formed in a particular chemical vapor deposition reaction from a reaction of at least two vaporized elements;
(c) introducing flows of said vaporized elements into said chamber, the relative magnitude of the flows of said at least two vaporized elements being so proportioned that they react to deposit gradient index optical material on said substrate; and (d) periodically reducing one at least of the flows of said vaporized elements into said chamber;

whereby the deposit of the gradient index optical material on said substrate is caused to be inhomogeneous index free.

18. A method as defined by claim 22 wherein said at least two vaporized elements comprise silicon/germanium ($Si_x Ge_{(1-x)}$) combining silicon sources such as silane, disilane and chlorinated silanes such as, though not limited to tetrachlorosilane and germanium sources such as germane, digermane and other germanium sources.

19. A method as defined by claim 17 wherein said at least two vaporized elements comprise gallium arsenide/aluminum arsenide ($Ga_x Al_{(1-x)} As$) wherein in step (c) the flow of the gallium and the aluminum source is changed while maintaining the arsenic source flow in order to provide the desired index gradient in the gradient index optical material deposited on said substrate.

20. A method as defined by claim 17 wherein said at least two vaporized elements comprise gallium indium phosphide ($Ga_x In_{(1-x)} P$) for values of x between zero and one.

21. A method as defined by claim 17 wherein said at least two vaporized elements comprise aluminum gallium nitride ($Al_x Ga_{(1-x)} N$) for values of x between zero and one.

22. A method for producing inhomogeneous index free gradient index optical materials, said method comprising the following steps in the following order:

(a) positioning a substrate in a chamber;

(b) heating said chamber and allowing the average temperature of the substrate to reach a chosen deposition temperature which is at least as high as the temperature required for the deposition of the particular inhomogeneous index free gradient index material to be formed in a particular chemical vapor deposition reaction from a reaction of a vaporized metallic material with at least two gaseous reactants;

(c) introducing flows of said vaporized metallic material and of said at least two gaseous reactants into said chamber, the relative magnitude of the flows of said at least two gaseous reactants being so proportioned that they react with said vaporized metallic material to deposit gradient index optical material on said substrate; and (d) periodically reducing some at least of the flows of said vaporized metallic material and of said at least two gaseous reactants into said chamber;

whereby the deposit of the gradient index optical material on said substrate is caused to be inhomogeneous index free.

23. A method as defined by claim 22 wherein in step (c) the vaporized metallic material introduced into said chamber is zinc and the two gaseous reactants introduced therein are hydrogen sulfide and hydrogen selenide, and wherein in step (d) the flow of vaporized zinc is held constant and the flows of hydrogen sulfide and hydrogen selenide are controlled such that an alloy $Zn S_x Se_{(1-x)}$ is formed and deposited on the substrate wherein the value of x is controlled by the partial pressures of the reactant gases, the partial pressures of the reactant gases being controlled by the flow rate thereof.

24. A method as defined by claim 23 wherein in step (c) the flow of vaporized metallic optical material is a flow of vaporized zinc and the flows of said at least two gaseous reactants is hydrogen sulfide and hydrogen selenide, the magnitudes of the flows of said at least two gaseous reactants being so proportioned that the reaction thereof with vaporized zinc produces the alloy $Zn S_x Se_{(1-x)}$ for values of x between zero and one.

25. A method as defined by claim 23 wherein in step (d) the ratio of the period of recurring reductions of flow to the duration of the reductions is in a range of five (5) to one hundred eighty (180).

26. A method as defined by claim 23 wherein in step (d) the ratio of the period of such recurring reductions of flow to the duration of the reductions is in a range extending at least from five (5) to one (1) to one hundred eighty (180) to one (1).

27. A method as defined by claim 26 wherein in step (d) the period of such successive reductions of flow is thirty (30) minutes.

28. A method as defined by claim 26 wherein in step (d) the period of such successive reductions of flow is fifteen (15) minutes.

29. A method as defined by claim 26 wherein in step (d) the period of such successive reductions of flow is fifty-four (54) seconds.

30. A method as defined by claim 22 wherein the recurring reductions of said some at least of the flows of said vaporized metallic optical material and of said at least two gaseous reactants into said chamber is to substantially zero flow.

31. A method as defined by claim 30 wherein in step (d) the duration of such reductions is approximately ten (10) seconds.

32. A method as defined by claim 22 wherein the flows of said vaporized metallic material and of said at least two gaseous reactants are substantially laminar.

* * * * *